United States Patent [19]
Stubbs

[11] Patent Number: 5,598,711
[45] Date of Patent: Feb. 4, 1997

[54] FLUID DEFLECTION METHOD USING A SKIRT

[75] Inventor: David M. Stubbs, Mountain View, Calif.

[73] Assignee: Lockheed Martin Corporation, Bethesda, Md.

[21] Appl. No.: 575,199

[22] Filed: Dec. 20, 1995

[51] Int. Cl.⁶ ........................................... F25B 19/02
[52] U.S. Cl. ............................................. 62/51.2; 250/352
[58] Field of Search ................................ 62/51.2; 250/352

[56] References Cited

U.S. PATENT DOCUMENTS

| | | | |
|---|---|---|---|
| 4,534,177 | 8/1985 | Wooding | 62/64 |
| 4,621,279 | 11/1986 | Maier et al. | 62/51.2 |
| 4,625,229 | 11/1986 | Maier | 62/51.2 |
| 4,838,041 | 6/1989 | Bellows et al. | 62/51.2 |
| 4,918,312 | 4/1990 | Wellman et al. | 62/51.1 |

Primary Examiner—Ronald C. Capossela
Attorney, Agent, or Firm—Henry J. Groth

[57] ABSTRACT

A method for deflecting a fluid supply using a skirt. The skirt comprising a remote and a close portion (with respect to distance from a fluid impinged surface). The skirt is located in close proximity to a surface to be impinged by the fluid. The deflection method is especially suited for use in conjunction with a Joule-Thomson cryostat and can also be used in conjunction with more than one cryostat for cooling of electronic devices. The remote portion of the skirt is disposed around the nozzle or nozzles of the fluid supply so that each fluid supply (or nozzle) extends through a hole in the remote portion of the skirt. The interior surface of the close portion of the skirt extends closer to the fluid impinged surface than each nozzle. The method efficiently wets the impinged surface with a fluid providing a measure of control over the outward velocity of the fluid as it progresses along the fluid impinged surface.

8 Claims, 7 Drawing Sheets

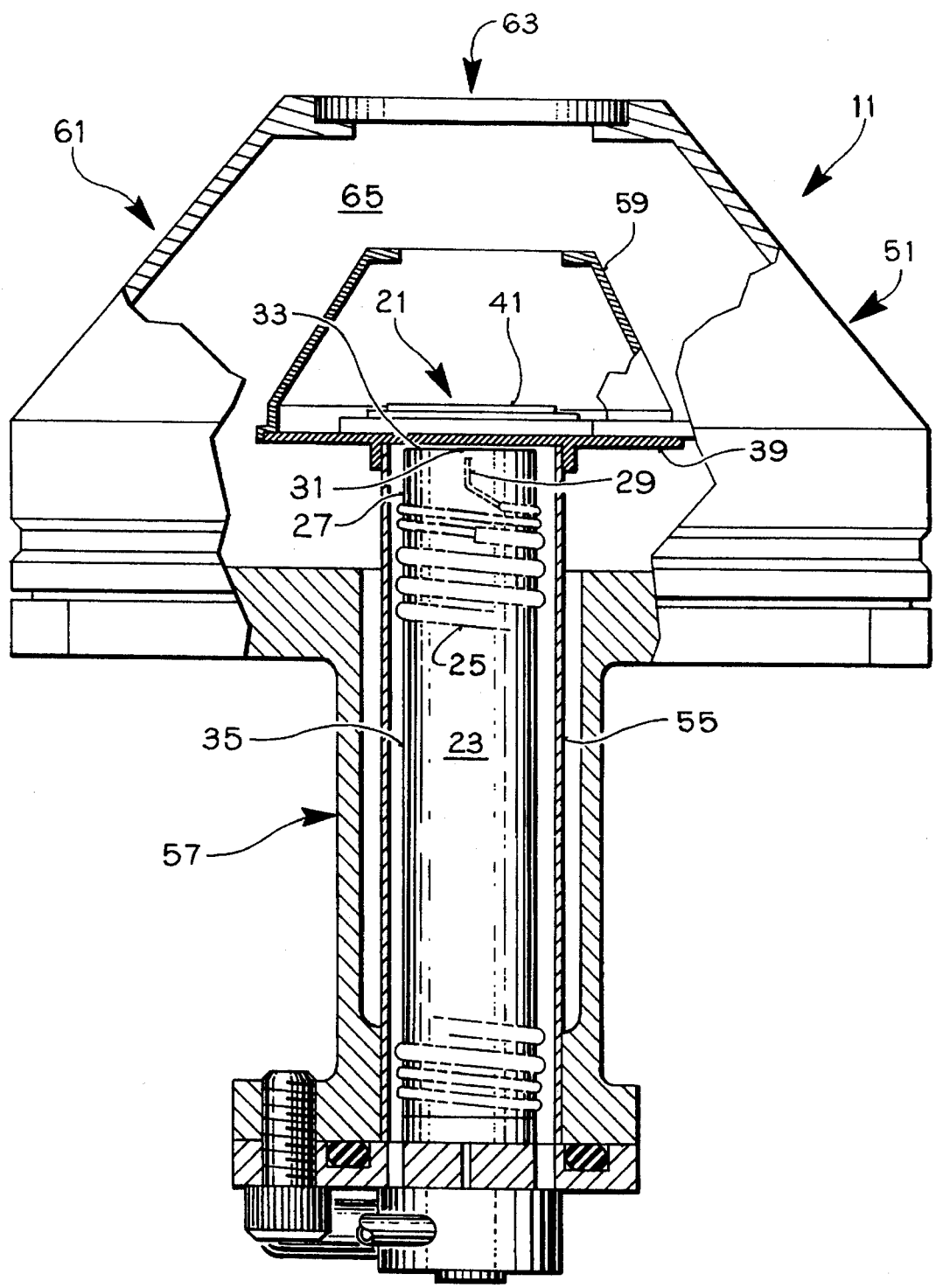
FIG_1 PRIOR ART

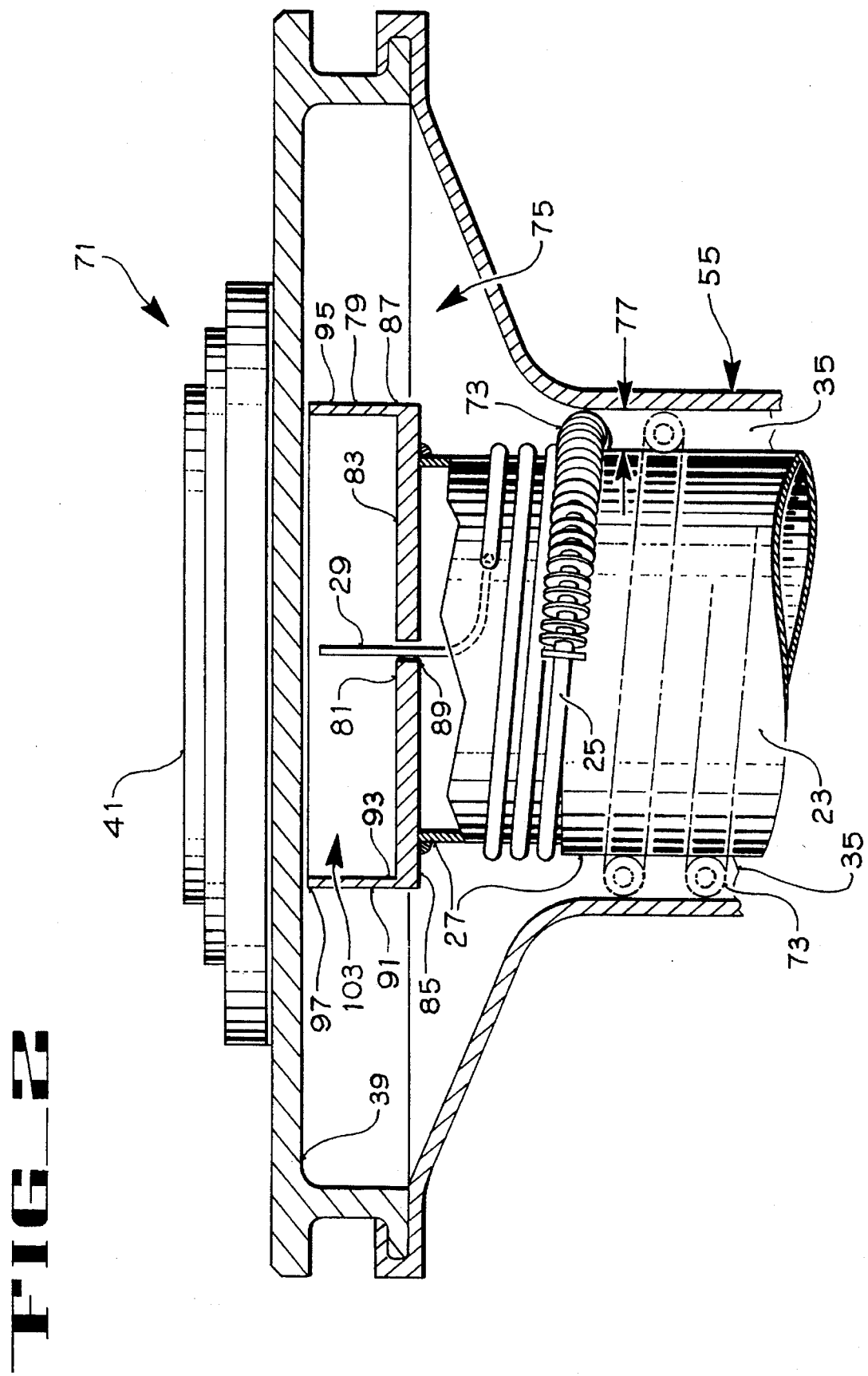
FIG_2

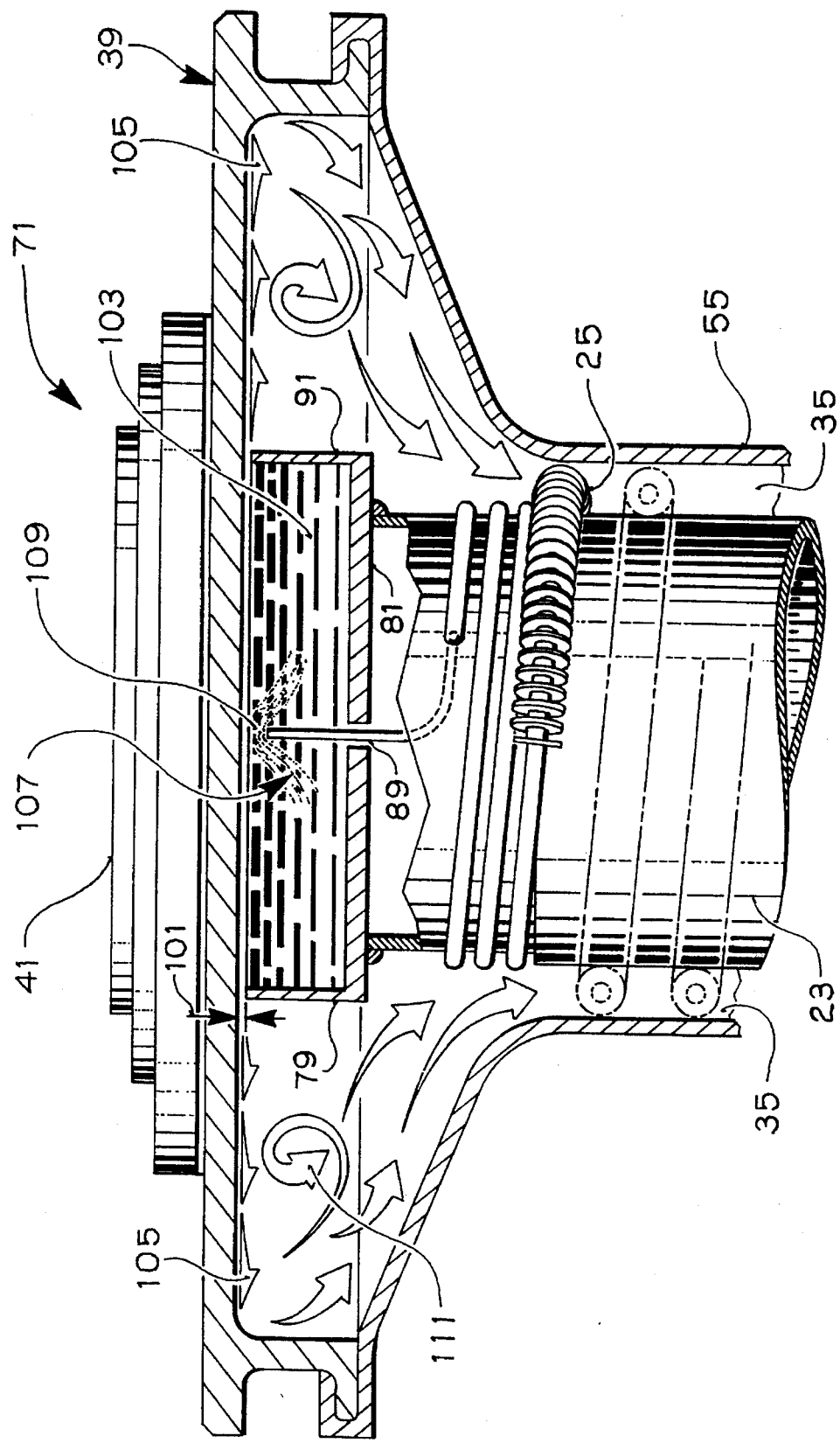
FIG_3

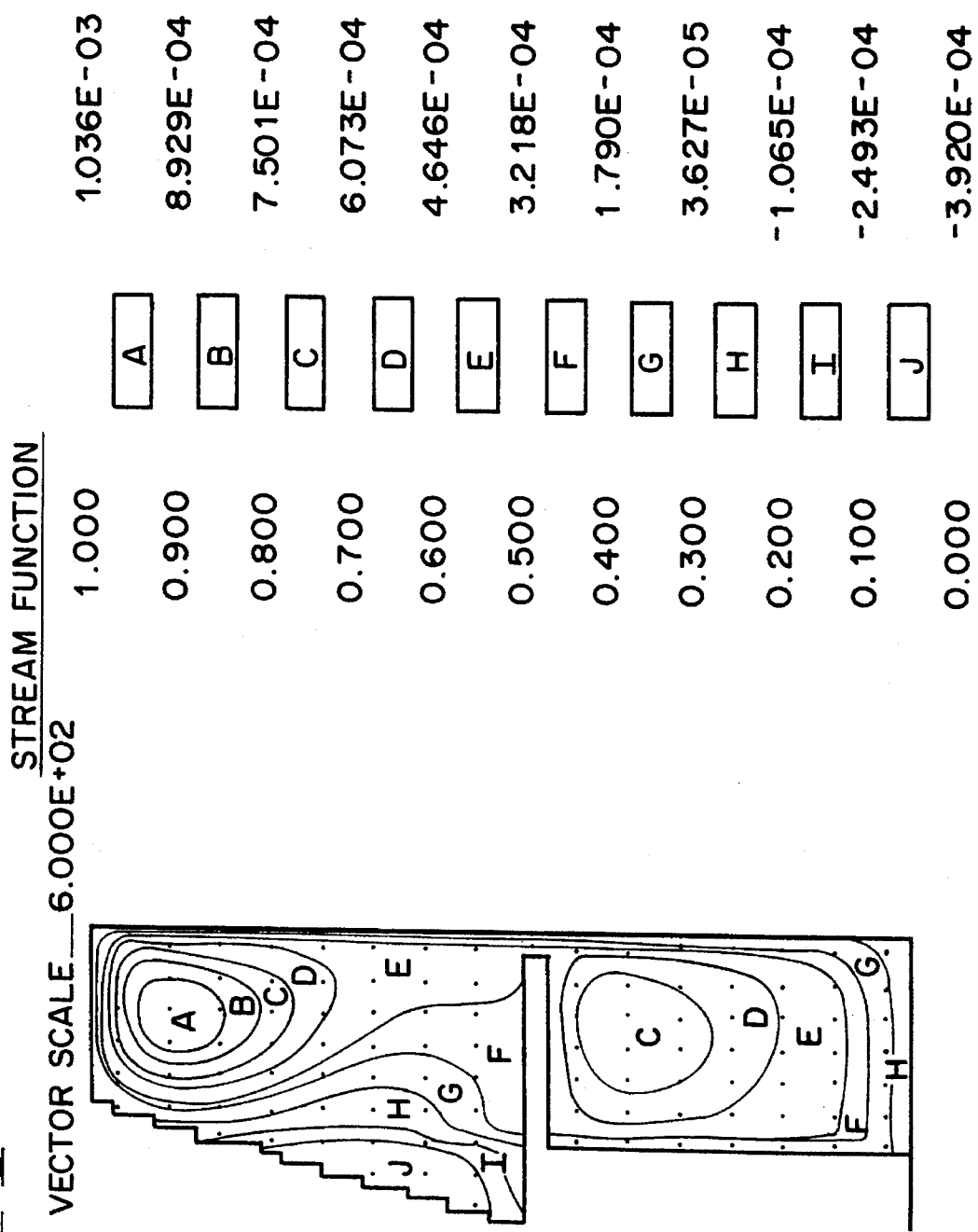
FIG_4

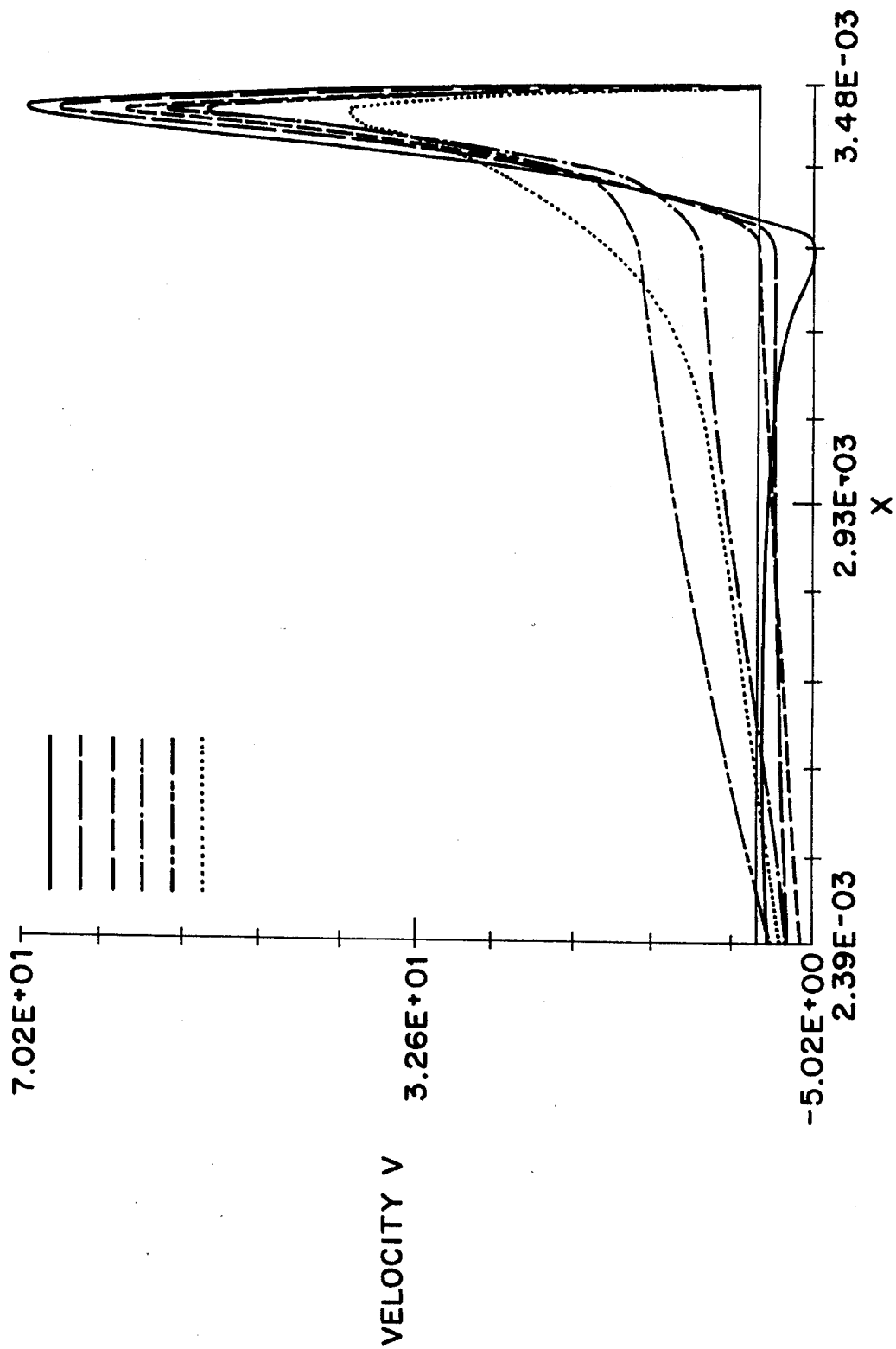
FIG_5

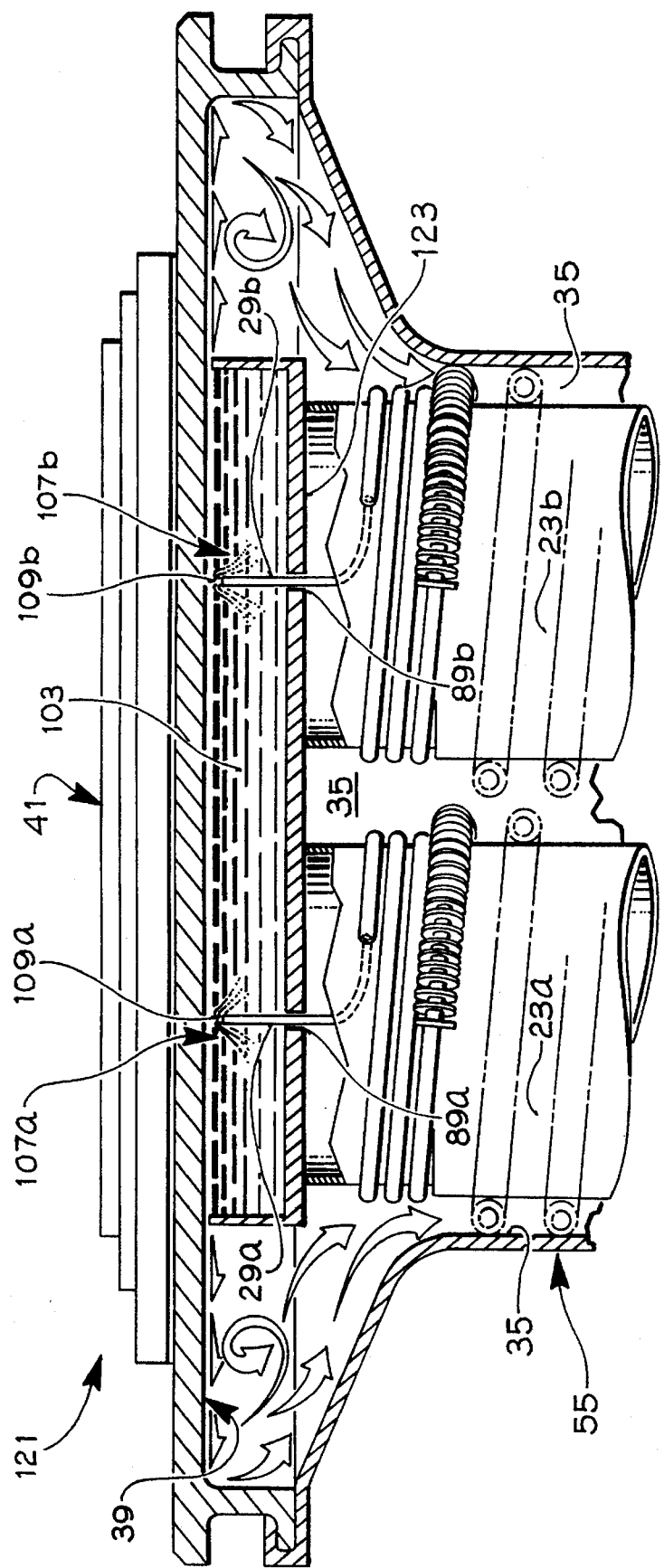

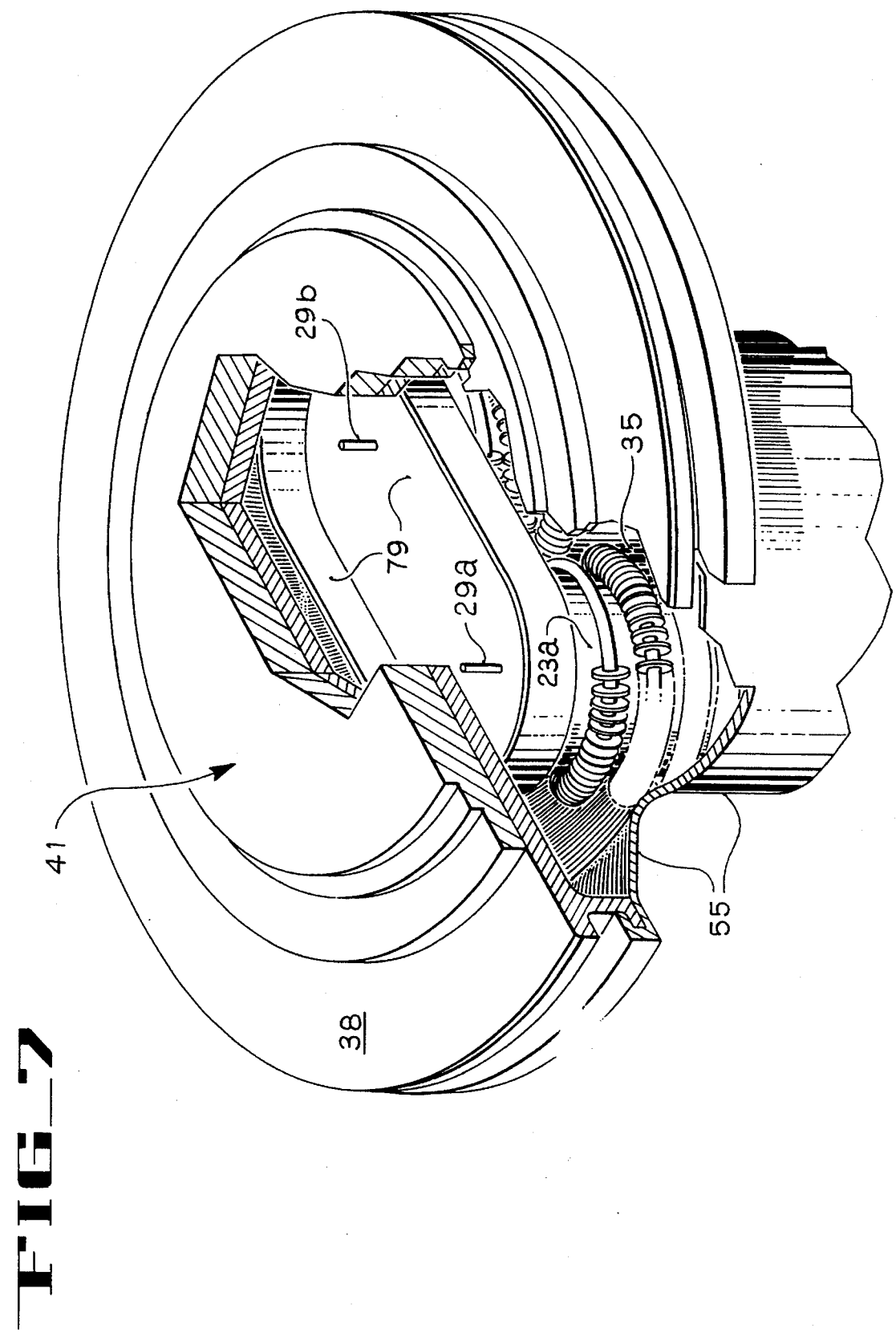

FLUID DEFLECTION METHOD USING A SKIRT

BACKGROUND OF THE INVENTION

1. Field of the Invention

The present invention generally relates to a method for deflecting a fluid flow using a skirt placed around and extending higher than the exit nozzle of a fluid supply system. The method employs a skirt placed in close proximity to a surface to be impinged by the fluid supply. The skirt controls the fluid providing a desired fluid velocity profile along the impinged surface. The invention relates in particular to cryogenic refrigeration utilizing the cooling effect of Joule-Thomson (isenthalpic) expansion of a high pressure refrigerant gas as it passes through a restricting orifice or expansion nozzle into a lower pressure two-phase (liquid-vapor) reservoir in conjunction with the skirt. The skirt deflection method controls the coolant flow direction as it exits the Joule-Thomson expansion nozzle forcing the coolant to remain in close contact with the cooled surface thereby providing for faster cool down times and more uniform temperatures over the entire cooled surface.

2. Background Art

Joule-Thomson refrigeration systems commonly have a configuration which includes helically tinned tubes wrapped around a mandrel. One end of the tubing opens into a reservoir that retains the liquified coolant in thermal contact with an object or surface to be cooled. Examples of objects or surfaces to be cooled by such a refrigeration system include infrared detectors or cold end plate surfaces bonded to detectors in a thermally conductive manner. Prior art Joule-Thomson coolers have been used for more than 20 years to cool infrared detectors and other temperature sensitive instruments.

Low pressure gas/liquid mixture coolant vaporizes as it cools the object and then flows in a return path along the fins outside the tubing to pre-cool the high pressure gas supply flowing inside the tubes toward the reservoir. Many variations of this configuration have been developed to improve the heat exchange between the supply and return gas and between the reservoir and the object being cooled. Other improvements have been to provide a thermostatically controlled supply gas shut-off valve for conserving the limited supply of coolant, and the use of a thermostatically self-regulating mechanism to automatically adjust the crosssectional area of the valve orifice in response to varying temperature, pressure and heat load to achieve high temperature stability. Examples of refrigeration systems employing this compact configuration are described in U.S. Pat. Nos. 3,942,010 to Peterson et al., 4,647,778 to Kline et al., 4,750,338 to Hingst, 5,077,979 to Skertic et al., 5,119, 637 to Bard et al., 5,150,579 to Hingst, and 5,337,572 to Longsworth. None of these systems employ a skirt to obtain faster cool down times and more uniform temperatures over the entire cooled surface.

Several spray deflection systems have been developed. However, these systems typically are used to deflect coating materials or water for cleaning, cooling, irrigation and fire protection. Spray deflection systems used for coating applications and water are described in U.S. Pat. Nos. 4,405,018 to Fischer, and 5,190,222, 5,275,340, and 5,333,794 to Haruch. None of these systems employs spray deflection for enhancement of cryogenic cooling systems.

SUMMARY OF THE INVENTION

It is an object of the present invention to deflect a fluid supply using a skirt placed in close proximity to the surface to be impinged by the fluid. The skirt comprises a remote (in terms of distance from the fluid impinged surface) laterally extending portion and a close portion which extends from the outermost edge of the remote portion towards the fluid impinged surface. The remote portion of the skirt is disposed around the nozzle of the fluid supply so that the fluid supply extends through a hole in the remote section. The close portion of the skirt extends closer to the fluid impinged surface than the nozzle. The skirt controls the outward movement of the fluid and deflects the fluid towards the fluid impinged surface. The skirt allows the fluid to efficiently wet the impinged surface and provides a measure of control over the outward velocity of the fluid as it progresses outside the skirt along the impinged surface. The momentum of the fluid tends to keep it moving in a straight line, radially outward along the fluid impinged surface.

A second object of the present invention is to provide a Joule-Thomson cryogenic cooling system that uses the skirt to force the cryogenic fluid against a cold end plate over an area many times larger than that of the cold tip of the Joule-Thomson cryostat generating the fluid so that more rapid cooling and more uniform cooled surface temperature are realized.

The second object is especially important for photoconductive (PC) and photovoltaic (PV) infrared imaging cameras which rely on cryogenic operating temperatures to keep semiconducting material electrons in the material valence band. When an incident energy packet strikes a PC or a PV device a valence election is induced to jump the semiconductor material's intrinsic band gap producing electronic conduction. However, if the semiconductor material's temperature rises with no incident energy, the number of electrons jumping the band gap increases thereby raising the electron flow through the material. This electron flow is referred to as "background" noise. This noise reduces the sensitivity, signal-to-noise ratio, of the detector and must be subtracted in the processing electronics. Further complications and inaccuracies are introduced by the use of background noise subtracting algorithms which subtract an "average" background noise value. The implicit assumption when using such algorithms is that the detector is in thermal uniformity and temperature equilibrium across its entire surface for the entire duration of its performance.

The second object is met by placing the skirt in close proximity to a cold end plate (impinged surface). The skirt enables the Joule Thomson fluid to remain in contact with the cold plate over an area more than four times that of the cryostat cold tip. The skirt acts as a control volume and accumulator. Its close proximity to the cold plate causes the coolant to flow radially out of a gap formed between the skirt and the cold plate at subsonic velocities along the rear surface of the cold plate.

A third object of the invention is to cool very large sensor arrays. The third object is met by ganging several Joule-Thomson cryostats together utilizing an all-encompassing skirt. This configuration provides for increased cooling capability while maintaining a very low thermal gradient over the entire fluid impinged surface of the cold end plate.

Fluid deflection methods in accordance with the present invention employ a nozzle, a fluid impinged surface, and a skirt. The nozzle has an upper end and an external diameter. Fluid emanates from an orifice located at the upper end of the nozzle. The fluid impinged surface faces the nozzle orifice.

The skirt employed by this method comprises a remote portion and a close portion. The remote portion has an interior surface that surrounds the nozzle, an exterior surface opposite the interior surface, and an outer edge. The remote portion also has an opening slightly larger than the nozzle external diameter. The nozzle extends through the opening so that the nozzle extends closer to the fluid impinged surface than the skirt remote portion interior surface.

The close portion of the skirt extends from the outer edge of the remote portion towards the fluid impinged surface so that the close portion extends closer to the fluid impinged surface than the nozzle orifice. The close portion of the skirt has an interior surface facing towards the nozzle and an opposite facing exterior surface.

The skirt employed by this method can also be used in conjunction with a plurality of nozzles. Where more than one nozzle is employed the skirt surrounds all the nozzles. The close portion of the skirt extends closer to the fluid impinged surface than any of the nozzles. The remote portion of the skirt has a plurality of openings. Each opening is slightly larger than its associated nozzle. Each nozzle extends through its associated opening in the remote portion so the nozzle extends closer to the fluid impinged surface than the remote portion of the skirt.

Methods which incorporate the features described above and which are effective to function as described above constitute specific objects of this invention.

Other and further objects of present invention will be apparent from the following description and claims and are illustrated in the accompanying drawings, which by way of illustration, show the preferred embodiments of the present invention and the principles thereof and what are now considered to be the best modes contemplated for applying these principles. Other embodiments of the invention employing the same or equivalent principles may be used and structural changes may be made as desired by those skilled in the art without departing from the present invention and the purview of the appended claims.

BRIEF DESCRIPTION OF THE DRAWING VIEWS

FIG. 1 is a drawing of a genetic enclosed cooled device assembly having a Joule-Thomson cryogenic refrigeration system, a cold plate, and an integral dewar well.

FIG. 2 is a drawing of one preferred embodiment of the present invention and shows a cooled device assembly employing a cryostat skirt.

FIG. 3 is a schematic of the coolant flow recirculation zones in the cooled device assembly shown in FIG. 2 and demonstrates the method of cooling employed by the present invention.

FIG. 4 provides stream functions for a Joule-Thomson cryostat with a skirt forming a gap with the cold end plate on the order of 0.010 inches.

FIG. 5 provides fluid velocity profiles for a Joule-Thomson cryostat with a skirt forming a gap with the cold end plate on the order of 0.010 inches.

FIG. 6 is a drawing of another preferred embodiment of the cooled device assembly for large area sensors or arrays having two Joule-Thomson cryocoolers and a multiple cryocooler skirt.

FIG. 7 is a three dimensional cutaway drawing of the multiple cryocooler skirt assembly of FIG. 6.

DETAILED DESCRIPTION OF THE PREFERRED EMBODIMENTS

With reference to FIG. 1, a cooled device assembly 11 comprising a Joule-Thomson cryocooler assembly 21 and an enclosure 51 is used in the prior art cooling method. The cryocooler assembly comprises a Joule-Thomson cryocooler 23, a cold end plate 39, and a device to be cooled 41.

The Joule-Thomson cryocooler comprises a tinned tube heat exchanger 25 helically wrapped around a cryocooler sleeve 27, an exit (expansion) nozzle 29, a partially liquified gas reservoir 31, an input section 33, and an output section 35.

The enclosure comprises a dewar well sleeve 55, a main housing 57, a cold shield 59, a cover 61, a window 63, and a housing internal volume 65.

Joule-Thomson refrigeration occurs by means of isenthalpic expansion of a high pressure gas which is cooled by the finned tube heat exchanger 25 passing through the expansion orifice or "exit nozzle" 29 into the lower pressure two-phase (partially liquified gas) reservoir 31. The input section of the cryocooler 33 therefore comprises the exit nozzle and the partially liquified gas reservoir.

The temperature change is proportional to the change in pressure of the coolant gas. Provided that the temperature of the gas remains below the inversion temperature, the reduction in pressure as the gas expands produces the reduction in temperature. A significant portion of the gas condenses into a liquid as it cools below the boiling point. By placing an object (device) in thermal contact with the two-phase reservoir, the device can be cooled. In one configuration found in the prior art, the coolant from the cryocooler is directed to impinge upon a cold end plate 39.

The liquid coolant in the partially liquified reservoir 31 evaporates as it draws heat away from the object to be cooled 41. By continuously replenishing the liquid and exhausting the gas (both the uncondensed and evaporated fractions) to maintain a constant vapor pressure over the liquid in the reservoir, the temperature will remain substantially constant over time. Optimally, the reservoir extends radially to the outer edge of the interior surface of the cold end plate 39 to ensure that the heat of vaporization is available to cool the entire device to be cooled. The heat load presented by the device to be cooled vaporizes the compressed gas condensate formed by the compressed gas as it exits from the nozzle 29 to a lower pressure.

The finned tube heat exchanger 25 comprises metal tubing that forms a helical winding around a cylindrical cryocooler sleeve 27 (spiral cooling fins are shown in FIG. 2). The tubing passes compressed gas from the bottom of the cryocooler to the exit nozzle 29 located at the top of the cryocooler. The finned tube heat exchanger is wrapped around more than seventy-five percent (75%) of the height of the cryocooler sleeve. Within the top twenty-five percent (25%) of the cryocooler 23, the cryocooler sleeve diameter is reduced and at that same height the fins cease to be disposed around the wound tube. The wound tube does continue to wind around the smaller diameter cryocooler sleeve until the tube passes through the sleeve and ends at the exit nozzle.

The heat exchanger 25 is placed in a volume known as a dewar well. The dewar well is encompassed by a cylindrically shaped member known as a dewar well sleeve 55. The coolant is exhausted from the partially liquified reservoir past the exterior of the heat exchanger in the output section 35 of the cryocooler, where the interior wall of the dewar well sleeve forms the outer boundary of the output section while the inner boundary of the output section is defined by the outer surface of the cryocooler sleeve 27. The flow of exhaust coolant in the output section pre-cools the high pressure coolant supply gas within the heat exchanger finned tubing thereby increasing the efficiency of the Joule-Thomson cryocooler.

The cold end plate 39 is placed in close proximity to the exit nozzle 29 and forms a plane, essentially perpendicular, within 0.038 cm (0.015 in) to the initial coolant flow emanating from the exit nozzle for the configuration presently in use. One surface of the cold end plate is facing the exit nozzle. For the purposes of identification and reference to the figures attached herein, this cold end plate surface is referred to as a lower surface of the end plate. The opposite surface of the cold end plate (herein referred to as the upper end plate surface) is bonded to the device to be cooled 41. The bond between the upper surface of the cold end plate and the device to be cooled is thermally conductive.

A main housing 57 having a lower portion and an Upper portion encloses the bottom portion of the cooled device assembly. The main housing is bonded at the bottom of the cryocooler to the dewar well sleeve 55. The lower portion of the main housing extends upwards along the cryocooler essentially parallel to the sleeve. The width of the upper portion of the main housing is greater than the width of the cold end plate 39.

A cold shield 59 is bonded to the outer edge of the upper surface of the cold end plate 39 to baffle unwanted radiation from impinging on the focal plane array. Thin-walled copper and/or nickel are typically used because of their high thermal conductivity.

A cover 61 is bonded to the top and along the outer edge of the main housing 57. The cover extends upwards above the cold shield 59 so that an opening somewhat larger than and directly above the device (or sensor, or focal plane array) to be cooled 41 is provided to ensure that an appropriate field of view may be realized by the array. A signal transparent window 63 is placed in this opening to seal the cooled sensor assembly so that the housing internal volume 65 retains its own atmosphere. Windows manufactured out of a suitable refracting material that is dependent on the operational wavelengths of the array sensors must maintain a vacuum leak-free seal to the cover. To avoid high thermal stress buildup in the window during the bonding process, indium or other low temperature solders are typically used here.

A dewar well sleeve 55 cantilevers and thermally isolates the focal plane array 41 from the main housing 57. The dewar well sleeve is thin-walled and is manufactured of low thermal conductivity materials such as austenitic stainless steel, Ti—6Al—4V, Fe—Ni (Invar) or Ni—Co (Kovar) alloys, to reduce thermal conduction from the warm (bottom) end. The cold end plate 39 is made of a thermally conductive material such as Invar or alumina, that closely matches the coefficient of thermal expansion of the focal plane array. The dewar well diameter is usually sized to match the surface area of attachment of the focal plane array and cold shield 59.

Sensors and chips requiring cooling are typically bonded to an alumina substrate using a thermally conductive epoxy adhesive to form the focal plane array 41. The cryocooler 23 develops a back pressure in the output section 35 due to a pressure drop across the exhaust side of the heat exchanger as a function of the coolant flow rate. The focal plane array epoxy adhesive thickness should be selected to provide minimum thermal mass and stress and maximum thermal conduction and strength.

With reference to the preferred embodiment of the invention shown in FIG. 2, the cooling method employs a cooled device assembly 71 including a skirt 79. Note that the enclosure 51 depicted in FIG. 1 (or its equivalent) has been omitted from FIG's 2, 3, 6 and 7 for clarity of presentation, but is in fact included in the constructions of the preferred embodiment assemblies. Also note that corresponding features in FIG's 2, 3, 6 and 7 are indicated with the same reference numerals as used in FIG. 1.

In general use, the skirt 79 acts as a device for deflecting flow of a fluid, emanating from a nozzle 29. The skirt enhances the wetting uniformity for a surface 39 to be wetted by the fluid (the fluid impinged surface). The skirt comprises a remote portion 81 (shown as horizontal in FIG. 2) and a close portion 91 (shown as vertical). The nozzle has an orifice at its upper end.

The remote portion 81 has an interior surface 83 surrounding the nozzle 29, an exterior surface 85 opposite the interior surface, and an outer edge 87 at its extreme horizontal extent. The remote portion is typically parallel to the surface upon which the fluid impinges. The remote portion has a centrally located opening 89 larger than the nozzle external diameter through which the nozzle extends closer to the fluid impinged surface 39 than the remote portion interior surface.

The close portion 91 extends (upwards in FIG. 2) from the outer edge 87 of the remote portion towards the fluid impinged surface 39. The close portion has an interior surface 93 facing towards the nozzle 29 and an opposite facing exterior surface 95. As compared to the nozzle orifice, the close portion extends closer to the fluid impinged surface.

As in the prior an Joule-Thomson cryocooler assemblies, the radially extending coolant fins 73 are provided around the heat exchanger's helically wound metal tubing. In the present invention, a lower portion of the dewar well sleeve remains cylindrical, while an upper portion of the dewar well sleeve 55 flares outward as it extends towards the cold end plate 39. The upper dewar well sleeve portion is attached to the cold end plate lower surface's outer portion. The outer edges of the coolant fins 73 lightly much the inner wall of the dewar well sleeve.

A primary coolant plenum 75 is formed by the upper portion of the dewar well sleeve 55 as it extends outwardly, away from the cryocooler 23, and is also defined by the lower (or interior) surface of the cold end plate 39. The coolant is collected in the primary plenum before being vented out through an annular gap 77 formed by the dewar well sleeve and the outer surface of the cryocooler sleeve 27. Note that the venting gas passes both sides of the helical tube of the heat exchanger 25 and fully hits the coolant fins as it moves through the output section 35.

Because the exit nozzle 29 is much smaller than the cold end plate 39 surface, there is concern about the coolant flow field distribution within the primary coolant plenum 75; particularly flow recirculation and flow separation. The skirt 79 comprising a horizontal (remote) portion 81 and a vertical (close) portion 91 is the key new feature of the present invention and has been shown to improve the wetting of the cold end plate by the coolant. Tests for the present invention configuration demonstrate that it provides efficient cooling for a cold end plate to exit nozzle spacing in the range of 0.076 cm to 0.154 cm (0.030 in to 0.060 in).

A cryocooler sleeve 27 acts as a mandrel defining the cylindrical surface around which the finned tube heat exchanger 25 is wound. The exterior surface 85 of the remote portion 81 of the skirt 79 is attached to the cryocooler sleeve and the remote portion has an opening 89 slightly larger than the exit nozzle 29. The exit nozzle extends through the skirt opening, and an orifice of the nozzle is disposed below the cold end plate 39. As discussed above, the distances from the nozzle orifice to the lower surface of the cold end plate range from approximately 0.076 cm to 0.154 cm (0.030 in to 0.060 in) for the configuration presently in use. Note, however, that the invention is scaleable and this distance would vary with, among other factors, the diameter of the cryocooler 23 and the area of the lower, coolant wetted surface of the cold end plate 39.

Referring to FIG. 3 which depicts the coolant flow recirculation zones, the remote portion 81 of the skirt 79 extends radially; approaching, but not exceeding, the inner diameter of the dewar well sleeve 55. Disposed at the horizontal portion's outer edge 87, the close portion 91 of the skirt extends towards the cold end plate 39. The skirt close portion's upper edge forms a skirt gap 101 of approximately 0.010 cm–0.040 cm (0.005 in–0.015 in) below the cold end plate 39. The close spacing of the close portion of the skirt to the end plate allows the coolant to remain in close contact with the cold plate over an area at least four times that of the cryostat cold tip area.

The skirt 79 acts as a control volume so that a controlled volume (skirt) coolant plenum 103 is formed in the vicinity of the exit nozzle 29. The skirt coolant plenum is used as an accumulator/back pressure chamber so that the exiting Joule-Thomson coolant can accelerate through the small skirt gap 101. The close proximity of the skirt to the cold end plate 39 causes the coolant to shoot out of the skirt gap at subsonic velocities along the lower surface of the cold end plate in a skirt gap coolant jet 105. This skirt gap coolant jet (wall) flows along the cold end plate lower surface thereby ensuring a high heat transfer rate. The very nature of the coolant's flow causes the coolant to remain in close contact with the cold end plate lower surface providing for a more uniform temperature along the entire cold end plate and increasing the cooling rate.

The skirt 79 has been shown to dramatically reduce the radial thermal gradient. As described above, the skirt provides increased wetting from a directed fluid flow of fluid from a nozzle 29 to a laterally extensive impingement surface 39. In a more generic application, for the skirt to substantially improve the wetting of the cold end plate, the distance of the skirt close portion from the cold end plate lower surface depends upon the coolant fluid density, pressure, and flow rate.

Three separate tests to determine temperature uniformity of the cryocooler designs shown schematically in FIG. 1 and FIG. 2 were conducted. A single stage, gaseous nitrogen Joule-Thomson cryostat was used on an infrared imaging camera dewar assembly. Average cool down times were between 60 to 70 seconds and an operating temperature of nearly 80° Kelvin was achieved. The temperature uniformity over the cold end plate 39 was approximately 30 times greater for the cryocooler assembly with the skirt 71 than for the assembly without the skirt 11. As detailed in the discussion of the second object, this uniformity fits the basic assumption of the background noise subtraction algorithm providing very accurate data for each sensor, or pixel, in the array; and thereby allowing more efficient signal processing.

Referring again to FIG. 3, with the skirt 79, there are two recirculation zones separated by the skirt. A skirt coolant plenum 103 is contained within a volume defined by the skirt and the lower surface of the cold end plate. The skirt coolant plenum reduces the extent of coolant flow recirculation and ensures that the coolants flows outward along the cold end plate 39.

Exit nozzle jet recirculation 107 is induced by the exit nozzle coolant jet 109 issuing from the exit nozzle 29 and impinging on the center of the lower surface of the cold end plate, where the exit nozzle coolant jet flow is then redirected away from the cold end plate after such impingement. The skirt gap 101 between the skirt coolant plenum and the cold end plate provides an opening for the skirt gap coolant jet 105 which flows radially outward along the lower horizontal surface of the cold end plate. In the preferred embodiment, the cold end plate has a downwardly extending lip at its outer edge. The lip is secured to the dewar well sleeve 55. The jet of coolant flowing out from the skirt gap creates a skirt jet recirculation 111 as the radially outwardly flowing coolant impinges the interior wall of the downwardly extending lip of the cold end plate. The wall of the skirt coolant plenum separates the exit nozzle jet recirculation zone from the skirt jet recirculation zone.

Referring to FIG. 4, computed stream functions are provided for the present invention with a skirt gap 101 on the order of 0.025 cm (0.010 in). These functions show that the skirt coolant plenum 103 achieves its intended effect and ensures that a high radial velocity of the coolant is maintained along the lower horizontal surface of the cold end plate 39.

Referring to FIG. 5, computed velocity profiles outside the skirt coolant plenum 103 are provided for the present invention with a skirt gap 101 on the order of 0.010 inches. The x-axis represents the distance from the cold end plate 39, with the cold end plate being located at the extreme right of the x-axis. The highest velocity profile (—) is for a radial location defined by the outer edge of the skirt coolant plenum. The velocity curves become progressively lower as the radial distance from the skirt coolant plenum increases. These profiles demonstrate that the radially outward coolant flow along the cold end plate is not deleteriously decreased by the skirt jet recirculation zone 111.

As previously discussed, a particularly useful application of subject cooling method is for devices such as infrared focal plane arrays. Referring to FIG. 1, the dewar well sleeve 55 is bounded on the bottom of its outer edge by the interior wall of the main housing 57. The cylindrical cross-sectional area of the dewar well for these applications is generally approximately 75% of the diameter of the cooled focal plane 41 area.

As the size of focal planes and other devices requiring cryogenic cooling increase, properly configured multiple Joule-Thomson cryocoolers will be employed to implement the subject cooling method. As shown in FIG. 6, cryocoolers may be ganged together in a multiple cryocooler skirt assembly 121, for these large focal plane arrays. For the multi-cryocooler skirt assembly coolant, flow from two or more cryocoolers (for example 23a and 23b) is directed to flow in an outward radial direction along the surface to be cooled by a multiple cryocooler skirt 123 which extends horizontally beyond all of the ganged cryocoolers.

I claim:

1. A method for deflecting flow comprising:
   (A) providing a nozzle for directing a fluid, the nozzle having:
      (i) an upper end,
      (ii) an orifice at the nozzle upper end from which a fluid emanates, and
      (iii) an external diameter,
   (B) positioning a fluid impinged surface facing the nozzle orifice so that the fluid is directed from the nozzle onto the fluid impinged surface, (C) positioning a skirt around the exit nozzle, the skirt comprising:
  (i) a remote portion having:
    (a) an interior surface surrounding the nozzle,
    (b) an exterior surface opposite the interior surface,
    (c) an outer edge, and
    (d) an opening slightly larger than the nozzle external diameter through which the nozzle extends closer to the fluid impinged surface than the remote portion interior surface, and
  (ii) a close portion extending from the outer edge of the remote portion towards the fluid impinged surface and extending closer to the fluid impinged surface than the nozzle orifice, the close portion having:
    (a) an interior surface facing towards the nozzle, and
    (b) an opposite facing exterior surface, and
(D) spacing the close portion a small gap from the fluid impinged surface, the gap directing the flow of the fluid along the fluid impinged surface.

2. A method for cooling a device by an expanding coolant fluid, the method comprising:
(A) mounting the device to be cooled on one side of a cold end plate, the cold end plate having an upper surface and a lower surface, the upper surface having an outer edge, and the device mounted to the upper surface,
(B) positioning an exit nozzle for directing a jet of expanding coolant fluid onto the lower surface of the cold end plate, the nozzle having:
  (i) an upper end,
  (ii) an orifice at the nozzle upper end from which the expanding coolant fluid emanates, and
  (iii) an external diameter,
(C) positioning a skirt around the exit nozzle so as to form a controlled volume coolant plenum around the exit nozzle and the lower surface of the cold end plate, the expanding fluid contained within the controlled volume coolant plenum, the skirt comprising:
  (i) a remote portion having:
    (a) an interior surface surrounding the nozzle,
    (b) an exterior surface opposite the interior surface,
    (c) an outer edge, and
    (d) an opening slightly larger than the nozzle external diameter through which the nozzle extends closer to the lower surface of the cold end plate than the remote portion interior surface, and
  (ii) a close portion extending from the outer edge of the remote portion towards the lower surface of the cold end plate and extending closer to the lower surface of the cold end plate than the nozzle orifice closer to the lower surface of the cold end plate than the nozzle orifice so that a small gap is formed between the close portion and the lower surface of the cold end plate so as to cause the fluid to flow along the lower surface of the cold end plate, the close portion having:
    (a) an interior surface facing towards the nozzle, and
    (b) an opposite facing exterior surface, and
(D) spacing the interior surface of the close portion of the skirt from the lower surface of the cold end plate to form a skirt gap, the skirt causing the expanding coolant fluid within the controlled volume coolant plenum to accelerate through the skirt gap, the fluid remaining in close contact with the entire lower surface of the cold end plate.

3. The method of claim 2 wherein the cold end plate and the exit nozzle are embodied in a Joule-Thomson cryocooler assembly and wherein the Joule-Thomson cryocooler assembly includes:
(A) a Joule-Thomson cryocooler having:
  (i) a cryocooler sleeve defining a basic cylindrical outline of the cryocooler and having an outer surface, the cryocooler bonded to the exterior surface of the remote portion of the skirt,
  (ii) a finned tube heat exchanger pre-cooling a compressed gas and comprising:
    (a) tubing which helically wraps around the cryocooler sleeve until the tubing extends inwardly through the sleeve and ends at the exit nozzle, the tubing carrying the compressed gas, and
    (b) fins extending radially from the tubing wrapped in a spiral fashion around the tubing, and
  (iii) an input section comprising the exit nozzle and a partially liquified gas reservoir, the exit nozzle providing a source of the reservoir formed by isenthalpic expansion of the high pressure gas through the exit nozzle, the reservoir located directly outside the exit nozzle, and
(B) a dewar well sleeve having an interior wall surrounding the heat exchanger and opposite facing exterior wall, the dewar well sleeve interior wall just touching the outermost edge of the fins and forming the outer boundary of an output section through which exhaust coolant flows thereby cooling the fins of the heat exchanger, the inner surface of the output section provided by the cryocooler sleeve outer surface,
where the exit nozzle extends higher than the cryocooler sleeve.

4. The method of claim 3 where the skirt gap is in the range of 0.010 cm–0.040 cm.

5. A method for deflecting flow comprising:
(A) providing nozzles for directing a fluid, each of the nozzles having:
  (i) an upper end,
  (ii) an orifice at the nozzle upper end from which a fluid emanates, and
  (iii) an external diameter,
(B) positioning a fluid impinged surface facing the nozzle orifices so that the fluid is directed from the nozzles onto the fluid impinged surface,
(C) positioning a skirt around the exit nozzles, the skirt comprising:
  (i) a remote portion having:
    (a) an interior surface surrounding the nozzles,
    (b) an exterior surface opposite the interior surface,
    (c) an outer edge, and
    (d) an opening slightly larger than the associated nozzle external diameter through which the nozzle extends closer to the fluid impinged surface than the remote portion interior surface, and
  (ii) a close portion extending from the outer edge of the remote portion towards the fluid impinged surface and extending closer to the fluid impinged surface than the nozzle orifices, the close portion having:
    (a) an interior surface facing towards the nozzles, and
    (b) an opposite facing exterior surface,
(D) providing a small gap between the close portion and the fluid impinged surface, the gap directing the flow of the fluid along the fluid impinged surface.

6. A method for cooling a device by an expanding coolant fluid, the method comprising:
(A) mounting the device to be cooled on one side of a cold end plate, the cold end plate having an upper surface and a lower surface, the upper surface having an outer edge, and the device mounted to the upper surface, (B) positioning exit nozzles for directing jets of expanding coolant fluid onto the lower surface of the cold end plate, each of the nozzles having:
  (i) an upper end,
  (ii) an orifice at the nozzle upper end from which a fluid emanates, and
  (iii) an external diameter, (C) positioning a skirt around the exit nozzles so as to form a controlled volume coolant plenum around the exit nozzles and the lower surface of the cold end plate, the expanding fluid contained within the controlled volume plenum, the skirt comprising:
  (i) a remote portion having:
    (a) an interior surface surrounding the nozzles,
    (b) an exterior surface opposite the interior surface,
    (c) an outer edge, and
    (d) openings slightly larger than each associated nozzle external diameter through which the associated nozzle extends closer to the lower surface of the cold end plate than the remote portion interior surface, and
  (ii) a close portion extending from the outer edge of the remote portion towards the lower surface of the cold end plate and extending closer to the lower surface of the cold end plate than the nozzle orifice so that a small gap is formed between the close portion and the lower surface of the cold end plate so as to cause the fluid to flow along the lower surface of the cold end plate, the close portion having:
    (a) an interior surface facing towards the nozzle, and
    (b) an opposite facing exterior surface, and (D) spacing the interior surface of the close portion of the skirt from the lower surface of the end plate to form a skirt gap, the skirt causing the expanding coolant fluid within the controlled volume coolant plenum to accelerate through the skirt gap, the fluid remaining in close contact with the entire lower surface of the end plate.

7. The method of claim 6 wherein the end plate and the exit nozzles are embodied in a Joule-Thomson cryocooler assembly and wherein the Joule-Thomson cryocooler assembly includes:

(A) Joule-Thomson cryocoolers each having:
  (i) a cryocooler sleeve defining a basic cylindrical outline of the cryocooler and having an outer surface, the cryocooler bonded to the exterior surface of the remote portion of the skirt,
  (ii) a finned tube heat exchanger pre-cooling a compressed gas and comprising:
    (a) tubing which wraps helically around the cryocooler sleeve until the tubing extends inwardly through the sleeve and ends at the exit nozzle, the tubing carrying the compressed gas, and
    (b) fins extending radially from the tubing wrapped in a spiral fashion around the cryocooler sleeve, and
  (iii) an input section comprising the exit nozzle and a partially liquified gas reservoir, the exit nozzle providing a source of the reservoir formed by isenthalpic expansion of the high pressure gas through the exit nozzle, the reservoir located directly outside the exit nozzle, and (B) a dewar well sleeve having an interior wall surrounding the heat exchangers and opposite facing exterior wall, the dewar well sleeve interior wall just touching the outermost edge of the fins and forming the outer boundary of an output section through which exhaust coolant flows thereby cooling the fins of the heat exchangers, the inner surfaces of the output section provided by the cryocooler sleeves outer surfaces, where each exit nozzle extends higher than the cryocooler sleeve.

8. The method of claim 6 where the skirt gap is in the range of 0.010 cm–0.040 cm.

* * * * *